United States Patent [19]
Baliga et al.

[11] Patent Number: 5,446,310
[45] Date of Patent: Aug. 29, 1995

[54] INTEGRATED CIRCUIT POWER DEVICE WITH EXTERNAL DISABLING OF DEFECTIVE DEVICES AND METHOD OF FABRICATING SAME

[75] Inventors: Bantval J. Baliga; Prasad Venkatraman, both of Raleigh, N.C.

[73] Assignee: North Carolina State University, Raleigh, N.C.

[21] Appl. No.: 895,339

[22] Filed: Jun. 8, 1992

[51] Int. Cl.⁶ .................................... H01L 23/48
[52] U.S. Cl. ................................ 257/529; 257/341; 257/368; 257/379; 257/431
[58] Field of Search ............ 257/529, 341, 368, 379, 257/431, 459; 365/174

[56] References Cited

U.S. PATENT DOCUMENTS

| | | | |
|---|---|---|---|
| 4,742,425 | 5/1988 | Conzelmann et al. | 361/104 |
| 4,786,958 | 11/1988 | Bhagat | 357/38 |
| 4,942,308 | 7/1990 | Conzelmann et al. | 307/202.1 |
| 4,975,782 | 12/1990 | Bauer | 357/38 |
| 5,021,861 | 6/1991 | Baliga | 357/51 |
| 5,025,298 | 6/1991 | Fay et al. | 357/41 |
| 5,097,448 | 3/1992 | Segawa | 365/200 |
| 5,100,829 | 3/1992 | Fay et al. | 437/60 |

OTHER PUBLICATIONS

*A Large Area MOS-GTO with Wafer-Repair Technique*, M. Stoisiek et al., IEDM, 1987, pp. 666–669.
*Modern Power Devices*, B. Jayant Baliga, John Wiley & Sons, 1987, pp. 263–343.

Primary Examiner—Mark V. Prenty
Attorney, Agent, or Firm—Bell, Seltzer, Park & Gibson

[57] ABSTRACT

An integrated circuit power device includes many cell blocks which are electrically connected in parallel, with each of the cell blocks including at least one cell such as MOSFET, electrically connected in parallel. External measurement access means such as test pads are electrically connected to each cell block, so that the cell blocks can be externally measured and a defective cell block can be identified. Externally activated disabling means such as fusible links are also provided, so that the fusible links connected to defective cell blocks can be opened. An operable integrated circuit power device is thereby obtained, notwithstanding a defective cell block. The fusible links are incapable of automatic activation in response to the defect in the cell block, but are externally opened upon detection of a defective cell block. By decoupling the defect measurement and cell disabling functions, low levels of leakage current may be specified for the power device. The fusible links are preferably formed using the same mask and material as the gate electrode, so that extra fabrication steps are not needed.

36 Claims, 4 Drawing Sheets

INTEGRATED CIRCUIT POWER DEVICE WITH EXTERNAL DISABLING OF DEFECTIVE DEVICES AND METHOD OF FABRICATING SAME

FIELD OF THE INVENTION

This invention relates to semiconductor devices, and more particularly to integrated circuit semiconductor power devices and methods for fabricating such devices.

BACKGROUND OF THE INVENTION

Power devices are widely used to carry large currents at high voltages. Since the early 1950's, developers of electronic power systems began to base their high power systems on semiconductor devices.

The power bipolar transistor was first developed in the early 1950's, and its technology has matured to a high degree, allowing the fabrication of devices with current handling capability of several hundred amperes and blocking voltages of 600 volts. However, despite the attractive power ratings achieved for bipolar transistors, there are several fundamental drawbacks in their operating characteristics. First, the bipolar transistor is a current-controlled device. A large base-drive current, typically one fifth to one tenth of the collector current, is required to maintain the power bipolar transistor in the on state. Even larger reverse base drive currents are necessary to obtain high speed turn-off. These characteristics make the base drive circuitry complex and expensive.

Bipolar transistors are also vulnerable to a second breakdown failure mode under the simultaneous application of a high current and high voltage to the device, as would commonly be required in inductive power circuits. It is also difficult to parallel bipolar power devices because the forward voltage drop in bipolar transistors decreases with increasing temperature. This decrease in forward voltage drop promotes diversion of the current to a single device which can lead to device failure.

The power Field Effect Transistor (FET) was developed to solve the performance limitations of power bipolar transistors. Power FETs are typically variants of the Insulated Gate FET (IGFET) or the Metal Insulator Semiconductor FET (MISFET). These device types are commonly referred to as Metal Oxide Semiconductor Field Effect Transistors (MOSFET) because they include a conducting gate electrode, typically metal, that is separated from a semiconductor surface by an intervening insulator, typically silicon dioxide. Accordingly, all field effect transistors which use a conducting gate electrode separated from a semiconductor surface by an intervening insulator will be referred to herein as MOSFETs.

The power MOSFET applies a control signal to the metal gate electrode that is separated from the semiconductor surface by an oxide. Accordingly, the control signal required is essentially a bias voltage, with no significant steady-state gate current flow in either the on-state or the off-state. Even when switching between these states, the gate current is small because it only serves to charge and discharge the input gate capacitance. The high input impedance is a primary feature of the power MOSFET that greatly simplifies the gate drive circuitry and reduces the cost of the power electronics.

Moreover, because current conduction in the MOSFET occurs through majority carrier transport only, no delays are observed as a result of storage or recombination of minority carriers in power MOSFETs during turn on. Their switching speed is therefore orders of magnitude faster than that of bipolar transistors. Power MOSFETs also possess an excellent safe operating area. That is, they can withstand the simultaneous application of high current and voltage for a short duration without undergoing destructive failure due to second breakdown. Power MOSFETs can also easily be paralleled, because the forward voltage drop of power MOSFETs increases with increasing temperature. This feature promotes an even current distribution in parallel devices.

In many present day power devices, large numbers of parallel-connected individual bipolar, MOS or other devices, commonly referred to as "cells" are fabricated in parallel in a single semiconductor integrated circuit, using well known microelectronic manufacturing techniques. Presently, up to 100,000 or more individual low current MOS-gated cells may be fabricated in parallel to produce a power device. The cells may be grouped in "cell blocks", each containing at least one cell and typically containing up to 1000 or more cells which are electrically connected in parallel. A power device may include up to 100 or more cell blocks, which are electrically connected in parallel between common source, drain and gate electrodes.

A major concern in fabricating a high current power device containing a large number of parallel cells is the yield of the resulting chip. In particular, it is difficult to provide a high yield high current power device in view of the defect rate of the individual cells on the semiconductor substrate. Since these individual cells are electrically connected in parallel, a short circuit in one cell renders the power device unusable. Accordingly, in practice, yields of only 30% are typically obtained even for relatively small chips with size of 0.25 inch by 0.25 inch.

One attempt at overcoming this yield problem is described in the article "A Large Area MOS-GTO with Wafer-repair Technique" by Stoisiek, et al., IEDM, 1987, pages 666–669. In this approach a MOS power device is fabricated out of about 300,000 individual MOS cells on a semiconductor substrate. The individual MOS cells are grouped into cell blocks, and each cell block is individually tested for faulty operation. The substrate is covered with an insulating layer, and a via hole pattern is etched into the insulating layer according to the results of the previous operational measurements, i.e. holes are etched only over the cell blocks without a fault. Consequently, the faulty cell blocks are insulated from the rest of the device. A metal layer connects all the operational cell blocks through the via holes. Thus, shorted cells are prevented from causing other cells to short circuit because they are not connected in parallel with the functional cells.

While the above described technique prevents a short circuit in one or more individual cell blocks from destroying the entire power device, this technique is not amenable to mass production of power devices. A custom mask must be designed for every wafer so that a via hole pattern may be etched on the insulating layer to connect only the fault-free cells or cell blocks. The cost of individual masks and the turn around time for designing the masks and then forming the individually designed via patterns makes the resultant devices prohibitively expensive. In addition, these operations increase the number of processing steps and add to overall fabrication cost for the large area device.

Another technique for overcoming the yield problem is described in U.S. Pat. No. 5,021,861 by the present inventor entitled *Integrated Circuit Power Device with Automatic Removal of Defective Devices and Method of Fabricating Same*. As described in this patent, defective cells are automatically disabled upon application of power to the power device without the need for testing of individual cells or customized mask generation. A fusible link formed of low melting point conductor is connected between each cell block to a common electrode of the power device. For example, in a MOS-gated device, a fusible link connects the gate electrode of the power device to the common gate of each cell block. The fusible link is designed to melt in response to a defect related short circuit current in the associated cell block. Accordingly, when the device is initially powered, all fusible links associated with short circuited individual cells will melt, so that the cell block containing the defective cell is disconnected. See also U.S. Pat. Nos. 4,742,425 entitled *Multiple-Cell Transistor with Base and Emitter Fuse Links* and 4,942,308 entitled *Power Transistor Monolithic Integrated Structure*, both to Conzelmann et al.

The above described technique eliminates the need to design and fabricate custom masks. Unfortunately, the minimum fusing current required to melt a fusible link is about ten milliamperes. Leakage currents below this value will not melt the fusible link. Conventional power devices possess gate leakage current in the range of microamperes, about one thousand times below the required fusing current. Accordingly, the power devices including the automatic disabling fusible links have a gate leakage current which can be one thousand times the acceptable level. In view of the above, there is a need for an integrated circuit power device and method of manufacturing same, which provides low leakage current (in the range of microamperes or less), while still allowing defective cells or cell blocks to be disconnected.

SUMMARY OF THE INVENTION

It is therefore an object of the present invention to provide improved integrated circuit power devices, and methods of fabricating such devices.

It is another object of the present invention to provide an integrated circuit power device structure and fabrication method which obtains a high yield.

It is still another object of the present invention to provide a low cost integrated circuit power device structure and fabrication method.

It is yet another object of the present invention to provide an integrated circuit power device structure and fabrication method which produces low leakage current and allows defective cell blocks to be disabled.

These and other objects are provided, according to the present invention, by forming external measurement access means in the integrated circuit power device so that external measurements may be taken of the individual cell blocks (each comprising one or more cells), to identify defective cell blocks. Externally activated disabling means are also formed in the integrated circuit. The externally activated disabling means are incapable of automatically disabling the defective cell blocks in response to the defect therein, but are capable of disabling the defective cell blocks upon external activation. An operable integrated circuit power device is thereby obtained, notwithstanding a defective one or more individual cell blocks. Moreover, by decoupling the defect measurement and cell disabling functions, any level of leakage current may be specified, and those devices which have a leakage current above the specified level may be externally disabled. Customized mask generation is not necessary.

In a preferred embodiment of the present invention, the external measurement access means includes test pads, which are formed in the integrated circuit. The test pads are electrically connected to the cell blocks to allow external measurement of the individual cell blocks and identification of a defective cell block. The externally activated disabling means preferably comprise fusible links, which are formed in the integrated circuit and which are electrically connected to the individual cell blocks. After external identification of the defective cell block, the fusible link associated therewith can be opened, using a high fusing current applied by a probe or using a laser or other known means, to thereby disable the defective cell block.

According to the invention, in a field effect transistor power device, a fusible link connects an electrode of the power device to the common gate of each cell block. The fusible link may be a high current fusible link, because it is not designed to automatically open in response to the gate leakage current. The fusible link may be formed of the same metal as the source and gate electrodes, thus eliminating extra processing steps during device fabrication. A low resistance fuse is also provided to enable high speed gate operation.

After the device is fabricated, electrical probes are placed on the common gate electrode and the common source electrode for a cell block. A gate bias test signal is applied to measure the leakage current for that cell block. If the leakage current is small, for example in the microampere range, no further action is taken. However, if a large leakage current is detected, a high current pulse may be applied between the ends of the fuse to open the fuse and thereby isolate the defective cell block from the gate drive circuit. Alternatively, a laser or other means may be used to open the fuse. Conventional probing stations may be used to serially test and disable each defective cell block, or to simultaneously test and disable all defective cell blocks.

Each cell block must be tested for leakage current because automatic disabling means is not provided by the present invention. Although this may consume some time during testing, it is readily accomplished using known test probing systems. Since the disabling of defective cell blocks is independent of the measured leakage current, low leakage currents may be specified and all cell blocks which exceed this low leakage current may be isolated, thereby producing a high quality, low leakage device. A separate mask for fabricating a special low current fuse is not necessary so that the device fabrication process may be simplified. Accordingly, the longer testing time is offset by the lower manufacturing cost and the low resultant leakage current for the completed device.

BRIEF DESCRIPTION OF THE INVENTION

DESCRIPTION OF A PREFERRED EMBODIMENT

Figure 1:
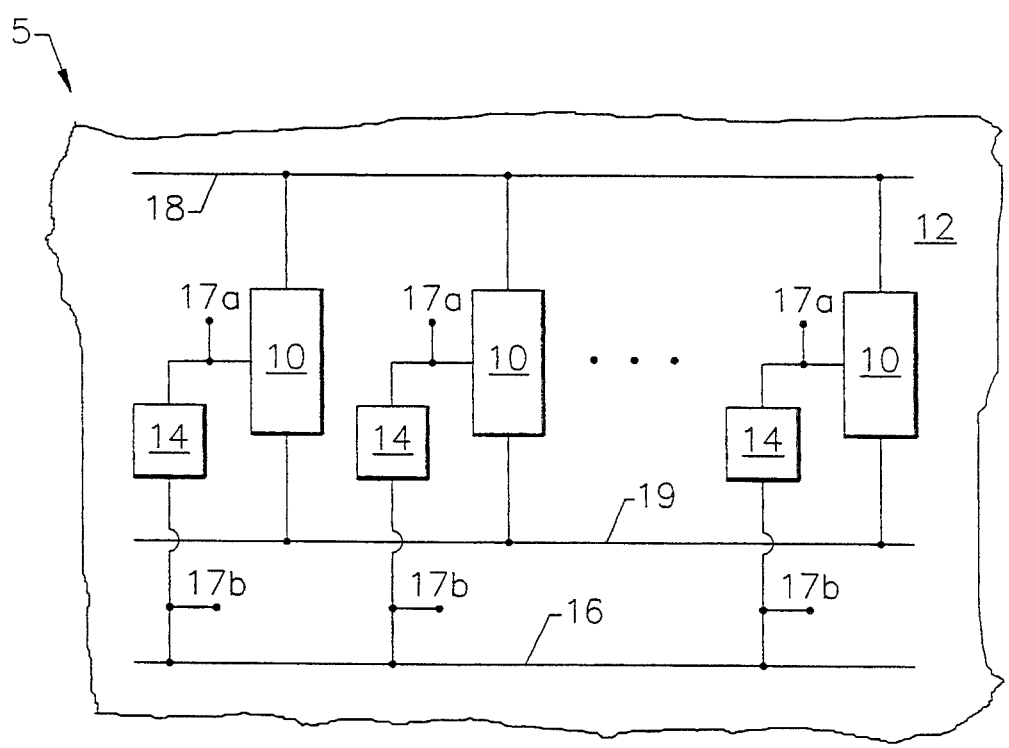
FIG. 1 is a schematic block diagram of an integrated circuit power device according to the present invention.

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. In the drawings, the thickness of layers and regions are exaggerated for clarity. Like numbers refer to like elements throughout.

Referring now to FIG. 1, a schematic view of an integrated circuit power device 5 according to the present invention is shown. The integrated circuit power device 5 includes a large number of individual cell blocks 10 which are formed in a semiconductor substrate 12. Substrate 12 is typically monocrystalline silicon, but other semiconductor substrates may also be used. Each cell block 10 includes one or more cells or active devices. Typically up to one thousand or more cells or active devices are included in each cell block, although a cell block may include only one cell or active device. The cell blocks 10 are electrically connected in parallel between first common electrode 18 and second common electrode 19. A common control electrode 16 may also be provided. The individual cell blocks 10 may be one or more metal oxide semiconductor-gated devices (MOS-gated devices) such as MOS-gated transistors or insulated gate bipolar transistors (IGBT), or other devices which are electrically connected in parallel to form a power device. When MOS-gated devices are used, the first common electrode 18 is typically a source electrode, the second common electrode 19 is the drain electrode and the control electrode 16 is the gate electrode. However, it will be understood that other devices will have other configurations.

According to the invention, each individual cell block 10 is electrically connected to the gate electrode 16 by an externally activated disabling means 14. External measurement access means, such as a pair of test pads 17a, 17b for each cell block 10, provides access for external measurement of the gate leakage current of each cell block 10 so that cell blocks having leakage currents which exceed a predetermined acceptable leakage current may be identified. If a defective cell block is identified, the externally activated disabling means 14 is externally activated to disable the defective cell block 10.

Disabling of the cell block 10 is not automatic. In other words, the externally activated disabling means 14 are incapable of automatically disabling the defective cell block in response to a defect therein. Rather, the externally activated disabling means 14 must be externally activated to disable the associated cell block. It will be understood by those having skill in the art that disabling means 14 need not be connected to cell blocks 10 via electrode 16. In fact, the disabling means need not be connected to any of the electrodes 16, 18 or 19, but may be connected to disable a cell block internally.

The externally activated disabling means 14 is preferably in the form of a fusible link. The fusible link may be opened or melted by a fusing current pulse which is externally applied to fusible link 14. For example, external probes may supply a current pulse through the appropriate test pads 17a, 17b. Alternatively, a laser or other means may be used to open the fusible link.

Figure 2:
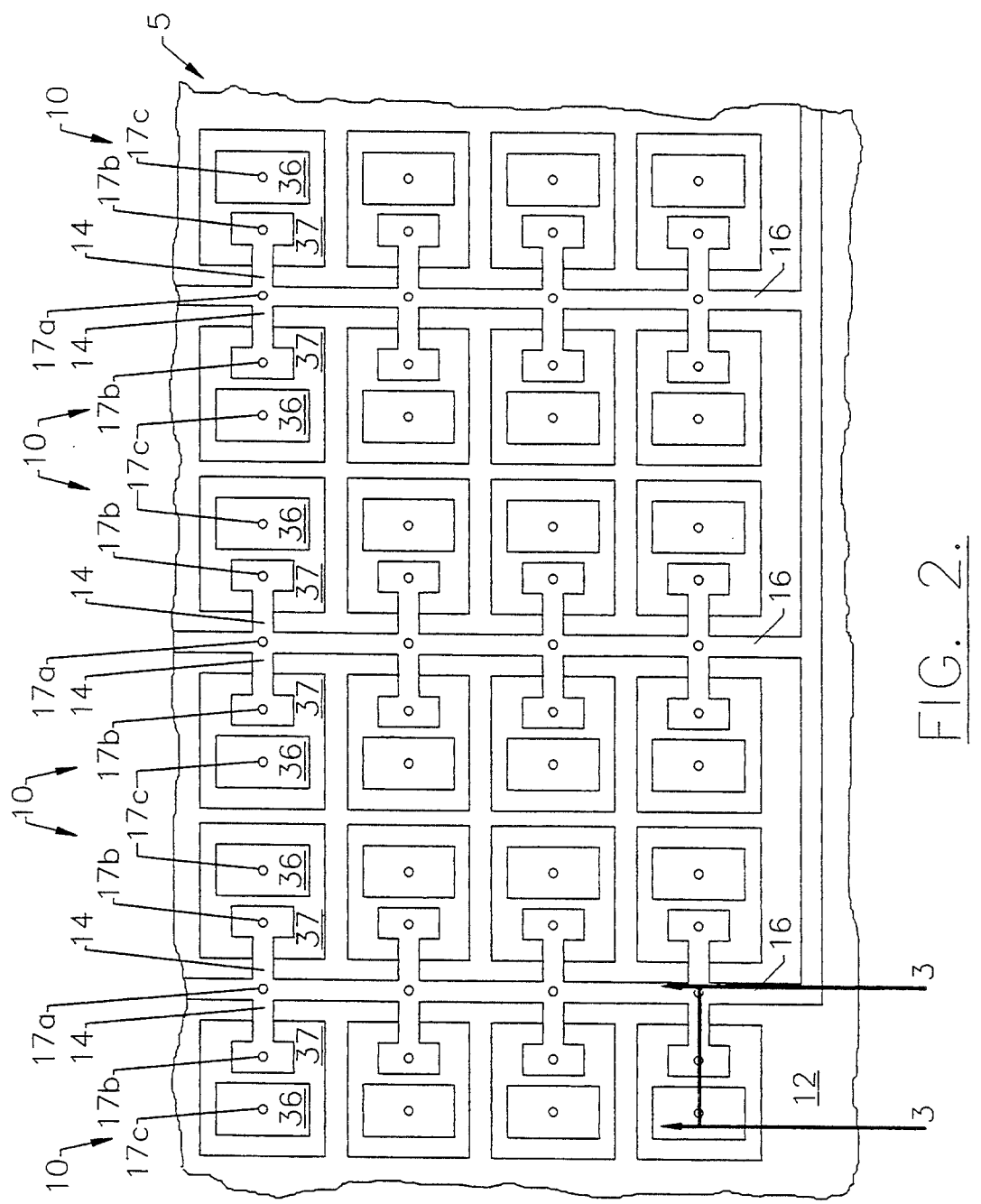
FIG. 2 is a top view of an integrated circuit power device embodying the present invention.

Referring now to FIG. 2, a schematic top view of an integrated power MOSFET 5 according to the invention is shown. An array of cell blocks 10 are formed in semiconductor substrate 12. The top surface of the cell block 10 includes source metal region 36 which is connected to all of the individual cells in the cell block 10. The top surface of the cell block 10 also includes a polysilicon gate region 37, to which the gates of the individual cells of the cell block 10 are connected. Polysilicon gate region 37 is connected to the gate electrode 16 via fusible links 14.

It will be understood by those having skill in the art that the top surface of the device is typically encapsulated so that the internal layers thereof are unaccessible. However, according to the present invention, in order to provide external measurement access means for the cell block 10, at least two test pads 17a and 17b are exposed for external contact. As shown, pads 17a are exposed on the gate electrode 16 adjacent one end of the fusible link 14, while pads 17b are exposed adjacent the opposite end of the fusible link 14. Accordingly, an appropriate current which is applied between points 17a and 17b melts the fusible link 14. As shown in FIG. 2, a third pad 17c is also exposed in the source metal 36 to allow measurement of the leakage current between gate 16 and the source metal 36. It will also be understood by those having skill in the art that other external measurement access means, such as optically activated interconnects, may be provided.

Figure 3A:
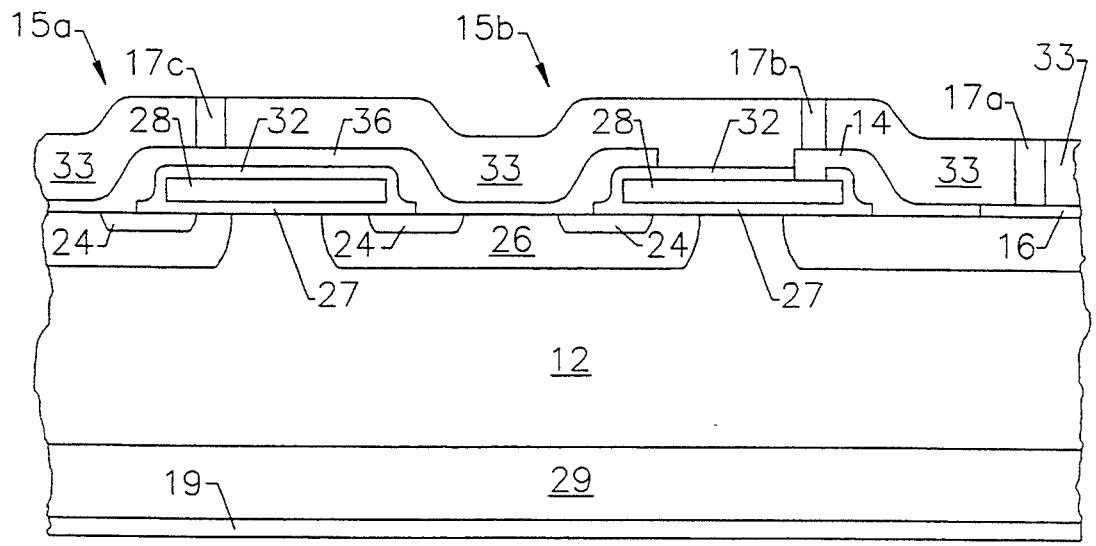
FIGS. 3A-3C are detailed cross-sectional views taken along line 3—3 of FIG. 2, illustrating intermediate fabrication steps for the power device of FIG. 2.

Referring now to FIG. 3A, a method of fabricating an integrated circuit power device according to the present invention will now be described. FIG. 3A illustrates a detailed cross-sectional view taken along line 3—3 of FIG. 2. As shown in FIG. 3A, two individual cells 15a and 15b are shown in semiconductor substrate 12. These cells 15a and 15b represent two adjacent cells at the end of cell block 10 as indicated by line 3—3 in FIG. 2. Cells 15a and 15b are in the form of metal oxide semiconductor field effect transistors (MOSFET). The source 24 is typically doped n+ and the base region 26 is typically a p-type doped region and driven deeper than the n+ source 24. The difference in lateral diffusion between the p-type base region 26 and the n+ source 24 region defines a surface channel region. An oxide layer 27, typically 0.1 μm thick, is formed on the substrate 12 by thermal oxidation or other well known techniques. A polysilicon gate 28 is formed on oxide 27, and is doped n-type at a high concentration. The drain 29 appears at the opposite face of the substrate 12 from the source 24. A drain electrode 19 is fabricated on the bottom face of the semiconductor substrate 12 to connect all drains together. The structure and fabrication steps for power devices 15 are described in the textbook entitled *Modern Power Devices* by the present inventor, published in 1987 by John Wiley and Sons, the disclosure of which is hereby incorporated herein by reference.

After the individual cells 15 are formed in the semiconductor substrate 12, an oxide layer 32 is formed on the polysilicon gate 28 as seen in FIG. 3A. The oxide layer 32 may be approximately 1 μm thick and may be formed by deposition or other conventional techniques. A metal layer 36, for example aluminum, is evaporated or deposited on oxide layer 32. Thus, the sources 24 are connected to the metal layer 36. This layer 36 serves as a common source contact for all individual cells 15 in all cell blocks 10. Gate electrode 16 and fusible link 14 are also formed on oxide layer 27, preferably simultaneously with source metal layer 36.

As shown in FIG. 3A, gate electrode 16, fusible link 14, and source metal layer 36 are formed in a single masking step, using a common material. Because fusible link 14 will be externally opened, special configurations and materials for a low melting current fusible link need not be used. Accordingly, a masking step is saved relative to the automatic disabling fusible links of prior U.S. Pat. No. 5,021,861.

Still referring to FIG. 3A, an optional oxide layer or other encapsulation layer 33 may be formed over the exposed surface of the device and discrete test pads 17a, 17b, 17c may be formed in vias in the oxide layer 33. Test pads 17a–17c allow probes to electrically contact the test pads without contacting adjacent conductive surfaces. However, it will be understood by those having skill in the art that probes may be contacted directly to exposed areas on gate contact 16, fusible link 14 and source metal 36.

Figure 3B:
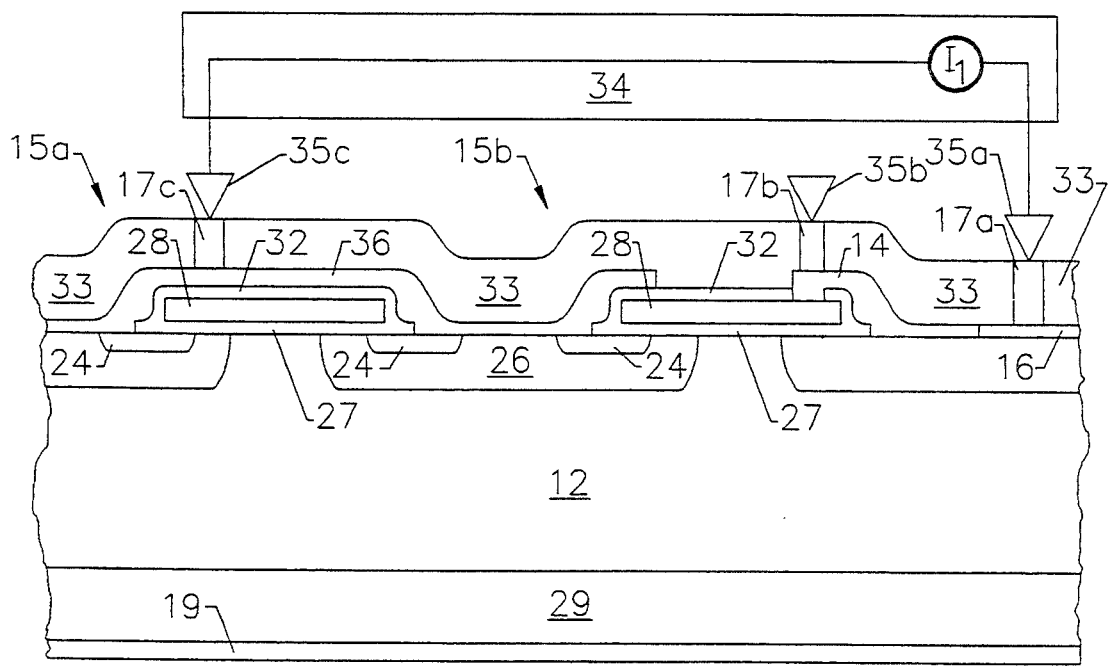

Referring now to FIG. 3B, the device of FIG. 3A is inserted into a well known test probe station 34 such as a model 260 marketed by Ruchers and Koll, and probes 35a–35c are directed to test pads 17a–17c respectively. Since a typical cell block site is on the order of $1/10'' \times 1/10''$, the probes of a conventional test probe station can be accurately positioned to contact the test pads 17a–17c. A gate bias test signal, such as a 5 volt DC test signal, is applied between probes 35b and 35c, and the current $I_1$ flowing between the probes is measured. This provides a measure of the leakage current between the gate electrode 16 and the source metal 36. If the leakage current is small, such as on the order of microamperes, then no further action is taken.

Figure 3C:
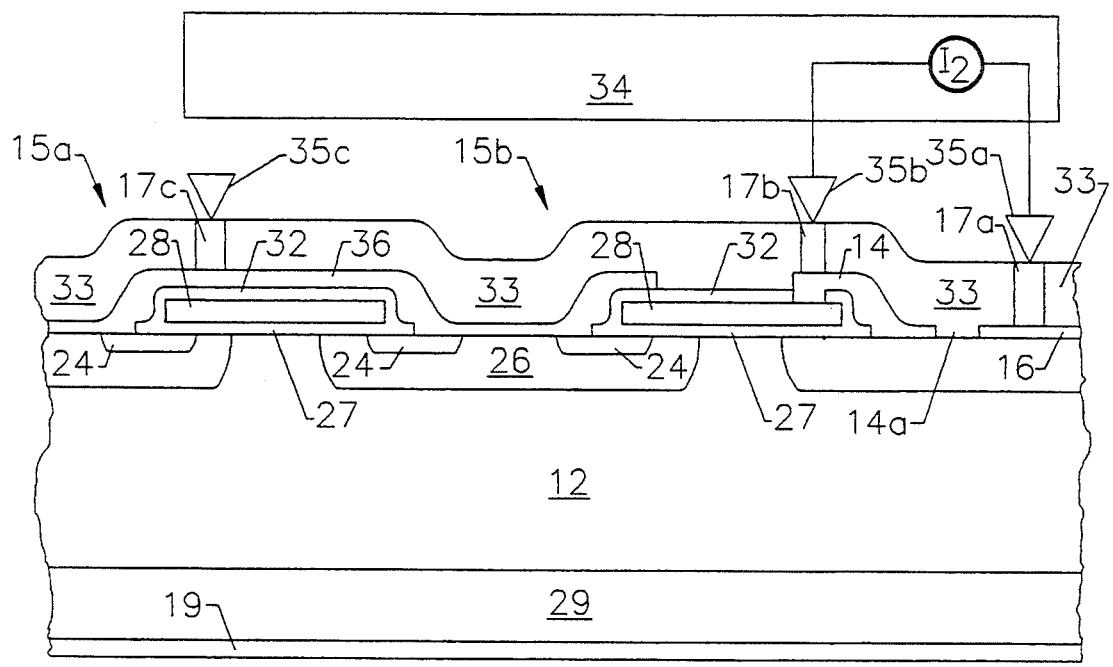

Referring now to FIG. 3C, if a gate current greater than the specified value is detected, a high current pulse $I_2$, such as a pulse of 0.1 ampere at 20 volts for a duration of 0.1 seconds, may be applied between probes 35a and 35b by the test probe station. As shown in FIG. 3C, this current pulse $I_2$ will open a portion 14a of fusible link 14, thus isolating the defective cell block 10 from the gate drive circuit. After testing and disabling, layer 33 and contact pads 17 may be removed, or another encapsulating layer may be formed on layer 33 to prevent external contact with pads 17a–17c. It will be understood by those having skill in the art that laser, electron beam or other techniques may be used to open the fuse, rather than application of a current pulse.

In a typical large area MOS-gated device, there may be up to one hundred or more cell blocks with each cell block including one thousand or more cells. Three test probes 35a–35c may be stepped from cell block to cell block during testing, as shown in FIGS. 3B–3C. A test routine can perform this task using known automated probe stations. The test routine also contains instructions on the acceptable gate leakage current. If the measured gate leakage current between probes 35a and 35c exceeds this threshold, a fusing current can be applied between the probes 35a and 35b to open the fusible link 14 prior to moving to the next cell block. It is therefore not necessary to record the defective cell block locations or perform any further wafer processing to remove the defects. It will also be understood by those having skill in the art that a large number of test probes, such as three hundred test probes, may be simultaneously applied to the device, to simultaneously test all one hundred cell blocks. The stepping operation is thereby avoided at the expense of a more complex test probe.

The present invention includes a number of advantages compared to known techniques for automatically disabling defective cell blocks, and known techniques for manually disabling cell blocks by custom designing a mask. In particular, low gate leakage currents can be specified, according to the present invention, because the leakage current is not related to the fusing current. Accordingly, devices with leakage currents on the order of microamperes may be produced. Moreover, since the fuse resistance can be made small, the polysilicon gate size can be selected independently of the fusing considerations because its capacitance can be large without limiting the switching time of the device. The fuse resistance can be made very small because it need not be a high resistance which will open under a low current. Finally, the fuse can be made using the same masking step and metal as the source region and gate electrode, thus obviating the need for extra processing steps. A separate mask for each power device need not be created, because standard automated probe stations may be used to individually test and disable defective cell blocks.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A power device comprising:
   an integrated circuit;
   a plurality of cell blocks formed in said integrated circuit and electrically connected in parallel, each of said cell blocks including at least one cell electrically connected in parallel, each cell handling a relatively small current so that said plurality of cell blocks electrically connected in parallel handle a relatively large current, at least one of said cell blocks being a defective cell block;
   at least one electrically or optically activated test pad formed in said integrated circuit and electrically connected to said cell blocks, such that said defective cell block is identified; and
   externally activated disabling means formed in said integrated circuit and electrically connected to said cell blocks, for disabling said defective cell block in response to external activation of said disabling means, said externally activated disabling means being incapable of automatically disabling said defective cell block in response to the defect therein;
   whereby defects in said plurality of cell blocks are externally identified, and defective cell blocks are externally disabled, to provide an operable integrated circuit power device notwithstanding defective cell blocks therein.

2. The power device of claim 1 further comprising a common electrode in said integrated circuit; said externally activated disabling means being connected between each cell block and said common electrode.

3. The power device of claim 2 wherein said at least one cell comprises a plurality of field effect transistors, each having a source, a drain and a gate, the sources of said field effect transistors being connected together, the drains of said field effect transistors being connected together and the gates of said field effect transistors being connected together; and wherein said externally activated disabling means comprises a plurality of externally activated disabling devices, a respective one of which is connected between said common electrode and the gates of the field effect transistors in a respective cell block.

4. The power device of claim 3 wherein said at least one electrically or optically activated test pad comprises a plurality of electrically or optically activated test pads, a respective one of which is connected between said common electrode and the sources of the field effect transistors in a respective cell block.

5. The power device of claim 1 wherein said externally activated disabling means comprises electrically activated disabling means, responsive to external electrical activation.

6. The power device of claim 1 wherein said externally activated disabling means comprises optically activated disabling means, responsive to external optical activation.

7. The power device of claim 2 wherein said common electrode and said externally activated disabling means are formed of same material.

8. The power device of claim 1 in combination with testing means, electrically connected to said at least one electrically or optically activated test pad and said externally activated disabling means, said testing means comprising:
means for identifying said defective cell block; and
means, responsive to said identifying means, for activating said externally activated disabling means, to disable said defective cell block.

9. A power device comprising:
an integrated circuit;
a plurality of cell blocks formed in said integrated circuit and electrically connected in parallel, each of said cell blocks including at least one cell electrically connected in parallel, each cell handling a relatively small current so that said plurality of cell blocks electrically connected in parallel handle a relatively large current, at least one of said cell blocks being a defective cell block; and
a plurality of fusible links formed in said integrated circuit and electrically connected to said cell blocks, for disabling said defective cell block in response to external opening of the fusible link associated with said defective cell block, said fusible links being incapable of automatically opening in response to said defective cell block being electrically connected thereto;
whereby defective cell blocks may be externally disabled, to provide an operable integrated circuit power device notwithstanding defective cell blocks therein.

10. The power device of claim 9 further comprising:
a plurality of test pads formed in said integrated circuit and electrically connected to said cell blocks, such that said defective cell block is identified.

11. The power device of claim 10 further comprising a common electrode in said integrated circuit; and wherein said plurality of test pads comprise a plurality of first and second test pads, a respective first test pad being electrically connected to a respective cell block, and a respective second test pad being electrically connected to said common electrode adjacent said first test pad, each respective first and second test pad providing measurement access to a respective cell block.

12. The power device of claim 9 further comprising a common electrode in said integrated circuit, and wherein said plurality of fusible links are electrically connected between said common electrode and a respective one of said cell blocks.

13. The power device of claim 11 wherein said at least one cell comprises a plurality of field effect transistors, each having a source, a drain and a gate, the sources of said field effect transistors being connected together, the drains of said field effect transistors being connected together and the gates of said field effect transistors being connected together; wherein said common electrode comprises a common gate electrode; and wherein a respective first test pad is electrically connected to the sources of the field effect transistors in a respective cell block and a respective second test pad is connected to said common gate electrode adjacent said first test pad.

14. The power device of claim 12 wherein said at least one cell comprises a plurality of field effect transistors, each having a source, a drain and a gate, the sources of said field effect transistors being connected together, the drains of said field effect transistors being connected together and the gates of said field effect transistors being connected together; wherein said common electrode comprises a common gate electrode; and wherein said plurality of fusible links are connected between said common gate electrode and the gates of the field effect transistors in a respective cell block.

15. The power device of claim 10 further comprising a common electrode in said integrated circuit; wherein said at least one cell comprises a plurality of field effect transistors, each having a source, a drain and a gate, the sources of said field effect transistors being connected together, the drains of said field effect transistors being connected together and the gates of said field effect transistors being connected together; wherein said common electrode comprises a common gate electrode, and said plurality of test pads comprise a plurality of first, second and third test pads; wherein a respective first test pad is electrically connected to the sources of the field effect transistors in a respective cell block, a respective second test pad is electrically connected to the gates of the field effect transistors in a respective cell block, and a respective third test pad is electrically connected to said common gate electrode adjacent said second test pad.

16. The power device of claim 9 wherein said plurality of fusible links comprise a plurality of electrically activated fusible links.

17. The power device of claim 9 wherein said plurality of fusible links comprise a plurality of optically activated fusible links.

18. The power device of claim 9 wherein said defective cell block has a predetermined leakage current and wherein said fusible links are incapable of being opened by said predetermined leakage current.

19. The power device of claim 11 wherein said common electrode and said fusible links are formed of same material.

20. The power device of claim 10 in combination with testing means, electrically connected to said test pads and said fusible links, said testing means comprising:

means for identifying said defective cell block; and
means, responsive to said identifying means, for opening said fusible links to disable said defective cell block.

21. A method of fabricating a power device comprising the steps of:

fabricating a plurality of parallel connected power device cell blocks in an integrated circuit each of said power device cell blocks including at least one parallel connected cell each cell handling a relatively small current so that said plurality of parallel connected power device cell blocks handle a relatively large current to thereby produce a power device, at least one of said power device cell blocks being a defective power device cell block;
applying test signals to said power device cell blocks to identify said at least one defective power device cell block; and then
disabling said at least one defective power device cell block after identification thereof by said test signals.

22. The method of claim 21 wherein said disabling step comprises the step of applying a current to said at least one defective power device cell block after identification thereof by said test signals.

23. The method of claim 21 wherein said disabling step comprises the step of applying optical energy to said at least one defective power device cell block after identification thereof by said test signals.

24. The method of claim 21 wherein said applying test signals step comprises the steps of:

applying voltage to said power device cell blocks to measure the leakage current thereof;
comparing the measured leakage current to a predetermined leakage current; and
identifying said at least one defective power device cell block if the measured leakage current exceeds the predetermined leakage current.

25. The method of claim 21 wherein said applying step and said disabling step are performed by testing means, electrically connected to said integrated circuit.

26. The method of claim 25 wherein said applying step and said disabling step are performed sequentially by said testing means, for each of said plurality of power device cell blocks.

27. The method of claim 25 wherein said applying step is performed simultaneously by said testing means for each of said plurality of power device cell blocks, and wherein said disabling step is performed simultaneously by said testing means for each of said power device cell blocks.

28. A method of fabricating a power device comprising the steps of:

fabricating a plurality of parallel connected power device cell blocks in an integrated circuit, each of said power device cell blocks including at least one parallel connected cell, each cell handling a relatively small current so that said plurality of parallel connected power device cell blocks handle a relatively large current to thereby produce a power device, at least one of said power device cell blocks being a defective power device cell block;
fabricating a plurality of fusible links in said integrated circuit, a respective one of which is electrically connected to a respective one of said power device cell blocks;
applying test signals to said power device cell blocks to identify said at least one defective power device cell block; and
opening the at least one fusible link associated with said at least one defective power device cell block after identification thereof by said test signals, to thereby disable said at least one defective power device cell block.

29. The method of claim 28 wherein said applying step is preceded by the step of:

fabricating a plurality of test pads in said integrated circuit, a respective one of which is electrically connected to a respective one of said power device cell blocks; and
wherein the step of applying test signals to said power device cell blocks comprises the step of applying test signals to said test pads.

30. The method of claim 28 wherein said fusible links fabricating step comprises the step of simultaneously fabricating said plurality of fusible links and a common control electrode electrically connected thereto.

31. The method of claim 28 wherein said opening step comprises the step of applying a fusing current to said at least one fusible link associated with said at least one defective power device cell block.

32. The method of claim 28 wherein said opening step comprises the step of applying optical energy to said at least one fusible link associated with said at least one defective power device cell block.

33. The method of claim 28 wherein said applying test signals step comprises the steps of:

applying a test voltage to said power device cell blocks to measure the leakage current thereof;
comparing the measured leakage current to a predetermined leakage current; and
identifying said at least one defective power device cell block if the measured leakage current exceeds the predetermined leakage current.

34. The method of claim 28 wherein said applying step and said opening step are performed by testing means, electrically connected to said integrated circuit.

35. The method of claim 34 wherein said applying step and said opening step are performed sequentially by said testing means, for each of said plurality of cell blocks.

36. The method of claim 34 wherein said applying step is performed simultaneously by said testing means for each of said plurality of power device cell blocks, and wherein said opening step is performed simultaneously by said testing means for each of said power device cell blocks.

* * * * *